United States Patent
Vasilache et al.

(10) Patent No.: US 8,924,202 B2
(45) Date of Patent: Dec. 30, 2014

(54) AUDIO SIGNAL CODING SYSTEM AND METHOD USING SPEECH SIGNAL ROTATION PRIOR TO LATTICE VECTOR QUANTIZATION

(75) Inventors: Adriana Vasilache, Tampere (FI); Marcel Cezar Vasilache, Tampere (FI)

(73) Assignee: Nokia Corporation, Espoo (FI)

( * ) Notice: Subject to any disclaimer, the term of this patent is extended or adjusted under 35 U.S.C. 154(b) by 1036 days.

(21) Appl. No.: 13/001,686

(22) PCT Filed: Jun. 30, 2008

(86) PCT No.: PCT/EP2008/058402
§ 371 (c)(1),
(2), (4) Date: Jan. 25, 2011

(87) PCT Pub. No.: WO2010/000305
PCT Pub. Date: Jan. 7, 2010

(65) Prior Publication Data
US 2011/0112841 A1    May 12, 2011

(51) Int. Cl.
*G10L 19/00* (2013.01)
*G10L 19/04* (2013.01)
*G10L 19/107* (2013.01)
*G10L 19/038* (2013.01)
*H03M 7/30* (2006.01)
*G10L 19/032* (2013.01)

(52) U.S. Cl.
CPC ............. *G10L 19/107* (2013.01); *G10L 19/032* (2013.01); *G10L 19/038* (2013.01); *H03M 7/3082* (2013.01)

USPC .......................................... 704/222; 704/230

(58) Field of Classification Search
CPC ........................... G10L 19/032; G10L 19/038
USPC .................................................. 704/222, 230
See application file for complete search history.

(56) References Cited

U.S. PATENT DOCUMENTS

| | | | |
|---|---|---|---|
| 6,516,297 B1 * | 2/2003 | Servetto et al. | 704/222 |
| 6,826,524 B1 * | 11/2004 | Kim et al. | 704/200 |
| 7,953,595 B2 * | 5/2011 | Xie et al. | 704/200.1 |
| 7,966,175 B2 * | 6/2011 | Xie | 704/229 |
| 2007/0168197 A1 * | 7/2007 | Vasilache | 704/503 |
| 2008/0097749 A1 * | 4/2008 | Xie et al. | 704/200.1 |
| 2008/0097755 A1 * | 4/2008 | Xie | 704/222 |
| 2009/0313027 A1 * | 12/2009 | Tabus et al. | 704/500 |

OTHER PUBLICATIONS

Agrell, Erik, et al. "Closest point search in lattices." Information Theory, IEEE Transactions on 48.8 (2002), pp. 1-15.*
Fonteles, et al. "Lattice vector quantization for normal mesh geometry coding." Acoustics, Speech and Signal Processing, 2006. ICASSP 2006 Proceedings. 2006 IEEE International Conference on. vol. 2. IEEE, 2006, pp. 1-4.*
Makhoul, et al. "Vector quantization in speech coding." Proceedings of the IEEE 73.11 (1985), pp. 1551-1588.*

(Continued)

*Primary Examiner* — James Wozniak
(74) *Attorney, Agent, or Firm* — Harrington & Smith

(57) ABSTRACT

An apparatus configured to model an encoded signal to estimate at least one distribution of the signal, rotate the signal with respect to a lattice, for lattice quantization of the signal, dependent on the at least one distribution of the signal, and quantize the signal rotated with respect to the lattice.

16 Claims, 11 Drawing Sheets

(56) References Cited

OTHER PUBLICATIONS

Simon, et al. "Design of successive approximation lattice vector quantizers." Acoustics, Speech, and Signal Processing, 1997. ICASSP-97., 1997 IEEE International Conference on. vol. 4. IEEE, 1997, pp. 2697-2700.*

Zhao, D.Y., et al., "GMM-Based Entropy-Constrained Vector Quantization", © 2007 IEEE, 4 pgs.

Vasilache, A., et al., "Indexing and Entropy coding of Lattice Codevectors", © 2001 IEEE, 4 pgs.

Ragot, S., et al., "Low-Complexity Multi-Rate Lattice Vector Quantization with Application to Wideband TCX Speech coding at 32 KBIT/S", © 2004 IEEE, 4 pgs.

Norden, F., et al., "Companded Quantization of Speech MDCT Coefficients", © 2005 IEEE, 11 pgs.

Hung, A.C., et al., "Multidimensional Rotations for Robust Quantization of Image Data", © 1998 IEEE, 12 pgs.

Subramaniam, A.D., et al., "Speech Spectrum Quantization Using Gaussian mixture Models and Multi-Dimensional Companding", © 2002 IEEE, 3 pgs.

* cited by examiner

AUDIO SIGNAL CODING SYSTEM AND METHOD USING SPEECH SIGNAL ROTATION PRIOR TO LATTICE VECTOR QUANTIZATION

FIELD OF THE INVENTION

The present invention relates to apparatus for coding, and in particular, but not exclusively for apparatus for quantization of speech or audio coding.

BACKGROUND OF THE INVENTION

Audio signals, like speech or music, are encoded for example for enabling an efficient transmission or storage of the audio signals.

Audio encoders and decoders are used to represent audio based signals, such as music and background noise. These types of coders typically do not utilise a speech model for the coding process, rather they use processes for representing all types of audio signals, including speech.

Speech encoders and decoders (codecs) are usually optimised for speech signals, and can operate at either a fixed or variable bit rate.

An audio codec can also be configured to operate with varying bit rates. At lower bit rates, such an audio codec may work with speech signals at a coding rate equivalent to a pure speech codec. At higher bit rates, the audio codec may code any signal including music, background noise and speech, with higher quality and performance.

In some audio codecs the input signal is divided into a limited number of bands. Each of the band signals may be quantized. From the theory of psychoacoustics it is known that the highest frequencies in the spectrum are perceptually less important than the low frequencies. This in some audio codecs is reflected by a bit allocation where fewer bits are allocated to high frequency signals than low frequency signals.

Quantization of these signals approximates the large number of discrete values generated by the audio codec to reduce the signal bandwidth required to store or transmit the coded signal.

Typical quantization approaches used in both audio and video coding is that of vector quantization (VQ) where several samples or coefficients are grouped together in vectors and each vector is then quantized or approximated with one entry of a codebook. The entry selected to quantize the input vector is typically the nearest neighbour in the codebook according to a distance criterion. As would be understood adding more entries with the codebook would increase the bit rate and the complexity but reduce the average distortion. The codebook entries are typically referred to as codevectors.

Construction of the codebook can be made by several ways, for example a training algorithm may be made to optimize the entries according to the source distribution.

In other known examples a structured codebook can be generated. One such structured codebook approach is the lattice vector quantization. In lattice vector quantization (lattice or algebraic VQ) the codebook is formed by selecting a subset of lattice points in a given lattice.

A lattice is a linear structure in N dimensions where all points or vectors can be obtained by integer combinations of N basis vectors. In other words all points can be obtained by a weighted sum of basis vectors with signed integer weights. A mathematical expression of any lattice point in a 2-dimensional lattice structure may for example be defined by:

$$y = k_1 v_1 + k_2 v_2,$$

or $$y = [y_1 \ y_2]$$
$$= [k_1 \ k_2]\begin{bmatrix} v_1 \\ v_2 \end{bmatrix}$$
$$= [k_1 \ k_2]\begin{bmatrix} v_{11} & v_{12} \\ v_{21} & v_{22} \end{bmatrix}$$

where the lattice point y is defined by a basis vectors v and integers k. The basis vectors may themselves be formed from the generators $v_{ij}$.

Typically the selected subset of lattice points rely on fixed rate or semi-variable rate coding (where the vector to be quantized is divided into sub-blocks for which the rate is variable but the overall bit rate for the global vector is fixed). An example of the semi-variable rate coding can be found in the IEEE paper "Low-complexity multi-rate lattice vector quantization with application to wideband TCX speech coding at 32 kbit/s" by Ragot et al. in Acoustics, Speech and Signal Processing, ICASSP '04 proceedings, Vol. 1 Pgs 501-504.

Furthermore variable rate encoding of the lattice codevectors has been attempted using grouping of codevectors on classes such as leader classes or shells for example as discussed in "Indexing and entropy coding of lattice codevectors" by Vasilache et al. in Acoustics, Speech and Signal Processing, ICASSP '01 proceedings, Vol 4 Pgs 2605-2608.

In some approaches variable rate encoding has been achieved by directly applying entropy encoding techniques to the lattice codevector components as discussed in "GMM-Based Entropy-Constrained Vector Quantization" by Zhao et al. in Acoustics, Speech and Signal Processing, ICASSP '07, Vol 4 Pgs 1097-1100.

Furthermore the lattice is typically not optimally organised with respect to the data used. The choice of the lattice is defined independently of any data correlation. Although there have been examples where the lattice used in lattice quantization was rotated as disclosed in "Multidimensional Rotations for Robust Quantization of Image Data", Hung et al, IEEE Transactions on Image Processing, Volume 7, Issue 1, January 1998, Page(s): 1-12, this document describes an approach to be used on non-correlated sources and would produce non-optimal performance for Gaussian distributed sources and correlated sources.

SUMMARY OF THE INVENTION

This invention proceeds from the consideration that the use of lattice rotations prior to lattice quantization and entropy coding can increase the encoding performance for low bit rate encoding. The local geometry of the lattice plays an important role in low bit rate encoding when only a few lattice points are considered for quantization. The rotation matrix is generated such that the denser direction of the lattice corresponds to the denser direction in the data.

Embodiments of the present invention aim to address or at least partially mitigate the above problem.

There is provided according to a first aspect of the present invention an apparatus configured to: model an signal to estimate at least one distribution of the signal; rotate the signal with respect to a lattice, for lattice quantization of the signal, dependent on the at least one distribution of the signal; and quantize the signal rotated with respect to the lattice.

Thus by performing the quantization of the signal after being rotated dependent on the lattice used to perform the lattice quantization it is possible to produce a quantized signal with lower distortion over the non-rotated quantization process.

The apparatus may further be configured to entropy encode the quantized signal.

The apparatus may be configured to model a signal to estimate at least two distributions, wherein for each quantization the apparatus is further configured to: estimate a distortion parameter associated with the quantized signal; and select one of the at least two distributions with the smallest associated distortion parameter.

Thus in embodiments of the invention the quantizer apparatus can perform a search using the different distributions to determine which one leads to the more accurate rotation and quantization process.

The distortion parameter may be the Euclidean distance between the quantized signal and the signal.

The modelling may comprise at least one of: a mixture of Gaussian modelling; a clustering analysis modelling; and a correlation analysis.

The apparatus may be configured to rotate the signal with respect to a lattice by applying a transform to the signal to rotate the signal by a first angle about a first axis.

The apparatus may be configured to apply at least one further transform to the rotated signal to further rotate the rotated signal by a further angle about a further axis.

The signal may comprise at least one vector wherein each vector comprises at least one transform coefficient.

The apparatus may be an encoder.

The apparatus is preferably at least one of: an audio encoder; a video encoder; and an image encoder.

According to a second aspect of the invention there is provided an apparatus configured to: determine at least one rotation angle and axis; apply the at least one rotation angle about the rotation axis to a first part of the encoded signal with respect to a lattice; and generate a de-quantized signal dependent on the rotated first part of the encoded signal with respect to the lattice.

The determination of the at least one rotation angle and axis may be dependent on a second part of the encoded signal.

The first part of the encoded signal is preferably entropy decoded prior to the rotation.

The second part of the encoded signal preferably comprises an index identifying a distribution for at least one component of the de-quantized signal, wherein the distribution is preferably associated with the at least one rotation angle and rotation axis.

The de-quantized signal may comprise at least one vector wherein each vector may comprise at least one transform coefficient.

The apparatus is preferably a decoder.

The apparatus is preferably at least one of: an audio decoder; a video decoder; and an image decoder.

According to a third aspect of the invention there is provided an apparatus configured to: rotate a vector signal with respect to a lattice, for lattice quantization of the signal, wherein the rotation is selected to align a densest lattice direction with a denser direction of the signal.

The apparatus may be further configured to determine a denser direction of the signal by applying a mixture of Gaussian model to the vector signal.

According to a fourth aspect of the invention there is provided a method comprising: modelling an signal to estimate at least one distribution of the signal; rotating the signal with respect to a lattice, for lattice quantization of the signal, dependent on the at least one distribution of the signal; and quantizing the signal rotated with respect to the lattice.

The method may further comprise entropy encoding the quantized signal.

Modelling the signal may comprise modelling the signal to estimate at least two distributions, and rotating and quantizing for each distribution wherein the method may further comprise: estimating a distortion parameter associated with the quantized signal; and selecting one of the at least two distributions with the smallest associated distortion parameter.

The distortion parameter is preferably the Euclidean distance between the quantized signal and the signal.

The modelling may comprise at least one of: a mixture of Gaussian modelling; a clustering analysis modelling; and a correlation analysis.

The rotation of the signal with respect to the lattice may comprise applying a transform to the signal to rotate the signal by a first angle about a first axis.

The rotation of the signal with respect to the lattice may further comprise applying at least one further transform to the rotated signal to further rotate the rotated signal by a further angle about a further axis.

The signal may comprise at least one vector wherein each vector may comprise at least one transform coefficient.

The method may further comprise generating a signal.

The method may further comprise: audio encoding; video encoding; and image encoding.

According to a fifth aspect of the invention there is provided a method comprising: determining at least one rotation angle and axis; applying the at least one rotation angle about the rotation axis to a first part of the encoded signal with respect to a lattice; and generating a de-quantized signal dependent on the rotated part of the encoded signal with respect to the lattice.

The method may further determine the at least one rotation angle and axis may be dependent on a second part of the encoded signal.

The method may further comprise the first part of the encoded signal is preferably entropy decoded prior to the rotation.

The second part of the encoded signal may comprise an index for identifying a distribution for at least one component of the de-quantized signal, wherein the distribution is preferably associated with the at least one rotation angle and rotation axis.

The de-quantized signal preferably comprises at least one vector wherein each vector comprises at least one transform coefficient.

The method may further comprise decoding the de-quantized signal.

The decoding may comprise at least one of: audio decoding; video decoding; and image decoding.

According to a sixth aspect of the invention there is provided a method comprising: rotating a vector signal with respect to a lattice, for lattice quantization of the signal, wherein the rotation is selected to align a densest lattice direction with a denser direction of the signal.

The method may further comprise determining the denser direction of the signal by applying a mixture of Gaussian model to the vector signal.

An electronic device may comprise the apparatus as described above.

A chipset may comprise apparatus as described above.

According to a seventh aspect of the invention there is provided a computer program product configured to perform a method comprising: modelling a signal to estimate at least one distribution of the signal; rotating the signal with respect to a lattice, for lattice quantization of the signal, dependent on the at least one distribution of the signal; and quantizing the signal rotated with respect to the lattice.

According to an eighth aspect of the invention there is provided a computer program product configured to perform a method comprising: determining at least one rotation angle and axis; applying the at least one rotation angle about the rotation axis to a first part of the encoded signal with respect to a lattice; and generating a de-quantized signal dependent on the rotated first part of the encoded signal with respect to the lattice.

According to a ninth aspect of the invention there is provided a computer program product configured to perform a method comprising: rotating a vector signal with respect to a lattice, for lattice quantization of the signal, wherein the rotation is selected to align the densest direction of lattice with a denser direction of the signal.

According to a tenth aspect of the invention there is provided an apparatus comprising: a first processing means for modelling a signal to estimate at least one distribution of the signal; a second processing means for rotating the signal with respect to a lattice, for lattice quantization of the signal, dependent on the at least one distribution of the signal; and a third processing means for quantizing the signal rotated with respect to the lattice.

According to an eleventh aspect of the invention there is provided an apparatus comprising: first processing means for determining at least one rotation angle and axis; second processing means for applying the at least one rotation angle about the rotation axis to a first part of the encoded signal with respect to a lattice; and third processing means for generating a de-quantized signal dependent on the rotated first part of the encoded signal with respect to the lattice.

According to a twelfth aspect of the invention there is provided an apparatus comprising: processing means for rotating a vector signal with respect to a lattice, for lattice quantization of the signal, wherein the processing means further select the rotation to substantially align a densest lattice direction with a denser direction of the signal.

BRIEF DESCRIPTION OF DRAWINGS

For better understanding of the present invention, reference will now be made by way of example to the accompanying drawings in which.

DESCRIPTION OF PREFERRED
EMBODIMENTS OF THE INVENTION

The following describes in more detail possible mechanisms for the quantization of signals. Although the below examples describe an audio signal being quantized according to embodiments of the invention it would be understood that the invention may be embodied to provide improved quantization of other signals. These may be but are not limited to video, image, audio, or speech or combinations of these signals.

Figure 1:
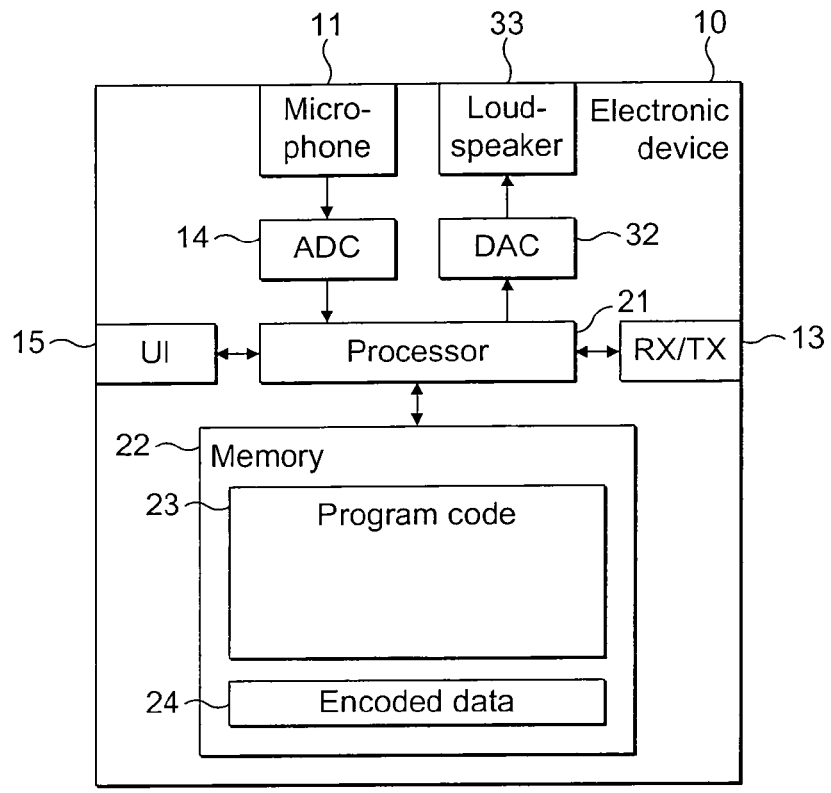
FIG. 1 shows schematically an electronic device employing embodiments of the invention.

Reference is first made to FIG. 1 which shows a schematic block diagram of an exemplary electronic device 10 or apparatus, which may incorporate a quantization codec according to an embodiment of the invention.

The electronic device 10 may for example be a mobile terminal or user equipment of a wireless communication system.

The electronic device 10 comprises a microphone 11, which is linked via an analogue-to-digital converter 14 to a processor 21. The processor 21 is further linked via a digital-to-analogue converter 32 to loudspeakers 33. The processor 21 is further linked to a transceiver (TX/RX) 13, to a user interface (UI) 15 and to a memory 22.

The processor 21 may be configured to execute various program codes. The implemented program codes comprise an audio encoding code for encoding a combined audio signal and code to extract and encode side information pertaining to the spatial information of the multiple channels. The implemented program codes 23 further comprise an audio decoding code. The implemented program codes 23 may be stored for example in the memory 22 for retrieval by the processor 21 whenever needed. The memory 22 could further provide a section 24 for storing data, for example data that has been encoded in accordance with the invention.

The encoding and decoding code may in embodiments of the invention be implemented in hardware or firmware.

The user interface 15 enables a user to input commands to the electronic device 10, for example via a keypad, and/or to obtain information from the electronic device 10, for example via a display. The transceiver 13 enables a communication with other electronic devices, for example via a wireless communication network.

It is to be understood again that the structure of the electronic device 10 could be supplemented and varied in many ways.

A user of the electronic device 10 may use the microphone 11 for inputting speech that is to be transmitted to some other electronic device or that is to be stored in the data section 24 of the memory 22. A corresponding application has been activated to this end by the user via the user interface 15. This application, which may be run by the processor 21, causes the processor 21 to execute the encoding code stored in the memory 22.

The analogue-to-digital converter 14 converts the input analogue audio signal into a digital audio signal and provides the digital audio signal to the processor 21.

The processor 21 may then process the digital audio signal in the same way as described with reference to FIGS. 2 and 3.

The resulting bit stream is provided to the transceiver 13 for transmission to another electronic device. Alternatively, the coded data could be stored in the data section 24 of the memory 22, for instance for a later transmission or for a later presentation by the same electronic device 10.

The electronic device 10 could also receive a bit stream with correspondingly encoded data from another electronic device via its transceiver 13. In this case, the processor 21 may execute the decoding program code stored in the memory 22. The processor 21 decodes the received data, and provides the decoded data to the digital-to-analogue converter 32. The digital-to-analogue converter 32 converts the digital decoded data into analogue audio data and outputs them via the loudspeakers 33. Execution of the decoding program code could be triggered as well by an application that has been called by the user via the user interface 15.

The received encoded data could also be stored instead of an immediate presentation via the loudspeakers 33 in the data section 24 of the memory 22, for instance for enabling a later presentation or a forwarding to still another electronic device.

Figure 3:
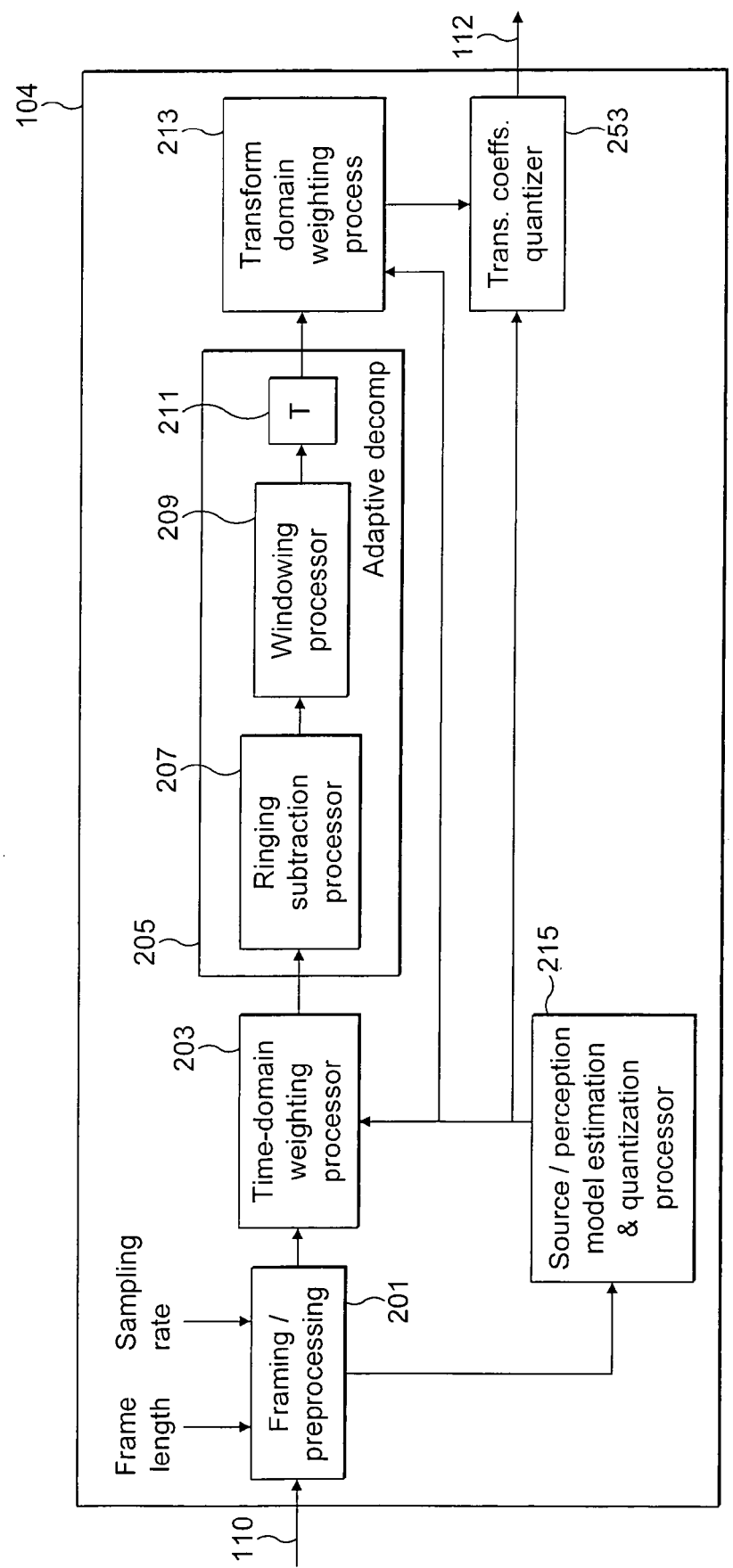
FIG. 3 shows schematically an encoder part of the audio codec system shown in FIG. 2.
Figure 4:
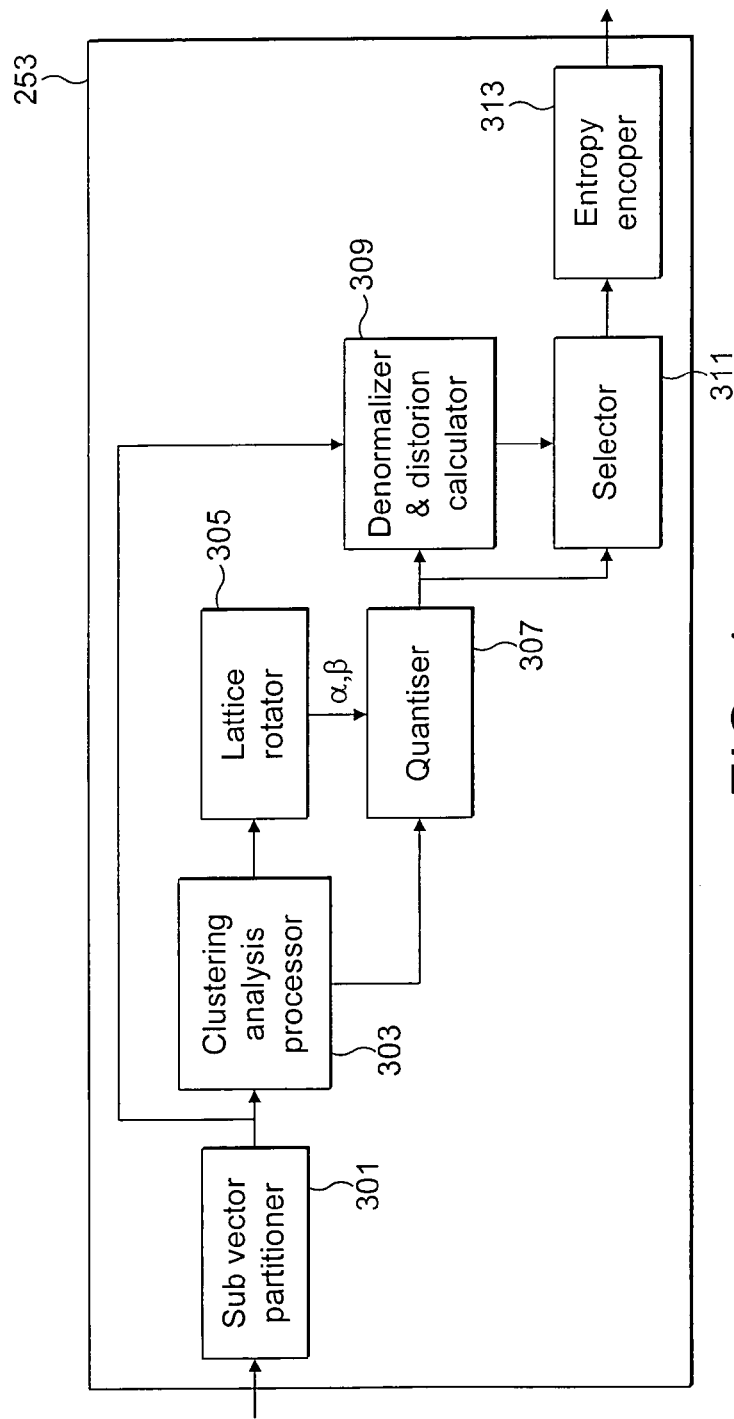
FIG. 4 shows schematically a quantization part of the encoder shown in FIG. 3.
Figure 5A:
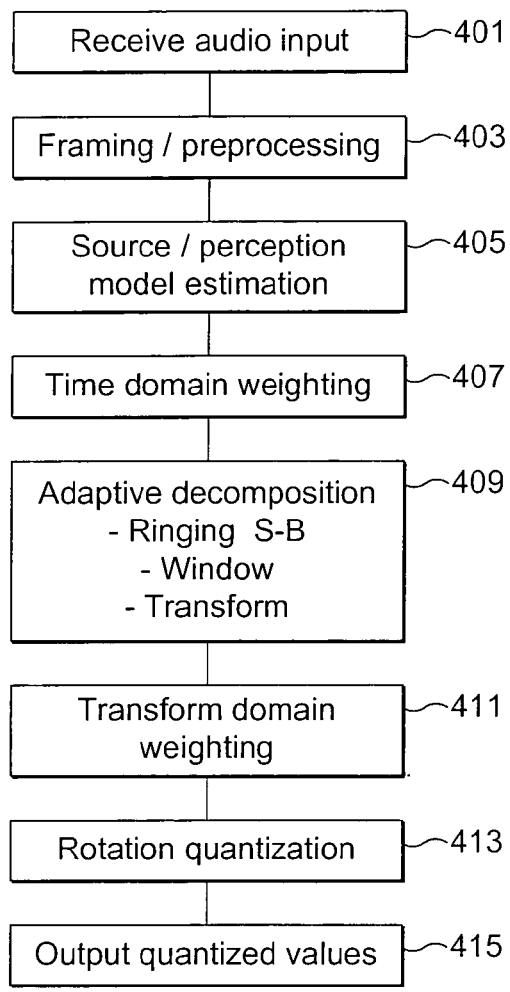
FIGS. 5a and 5b shows a flow diagram illustrating the operation of an embodiment of the audio encoder as shown in FIGS. 3 and 4 according to the present invention.
Figure 5B:
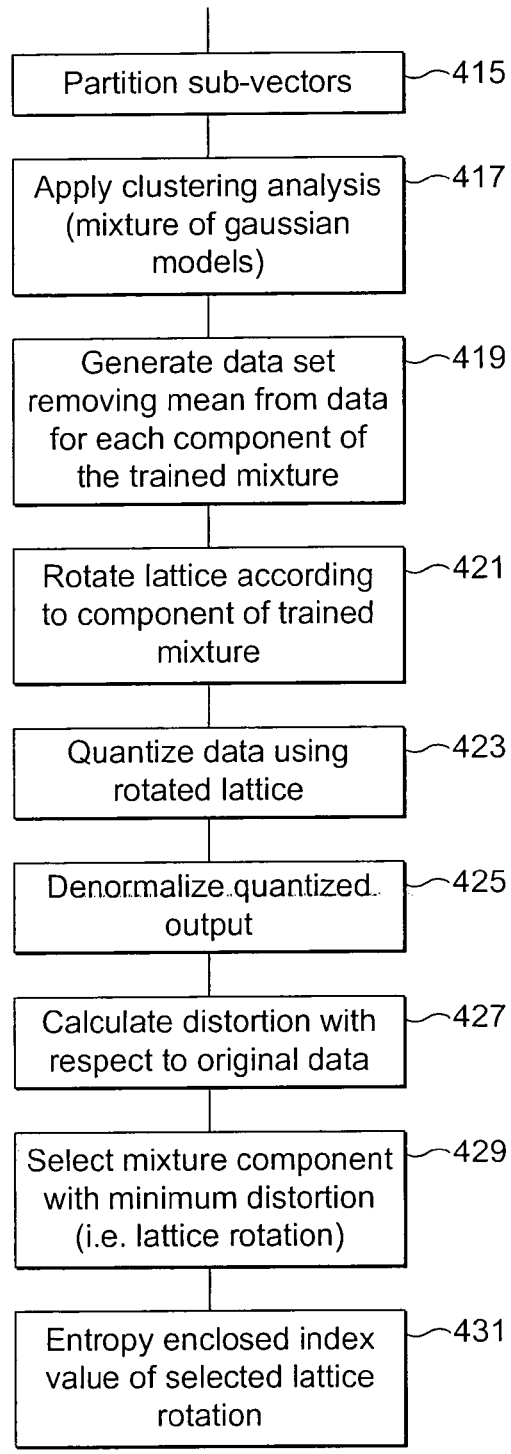
Figure 11:
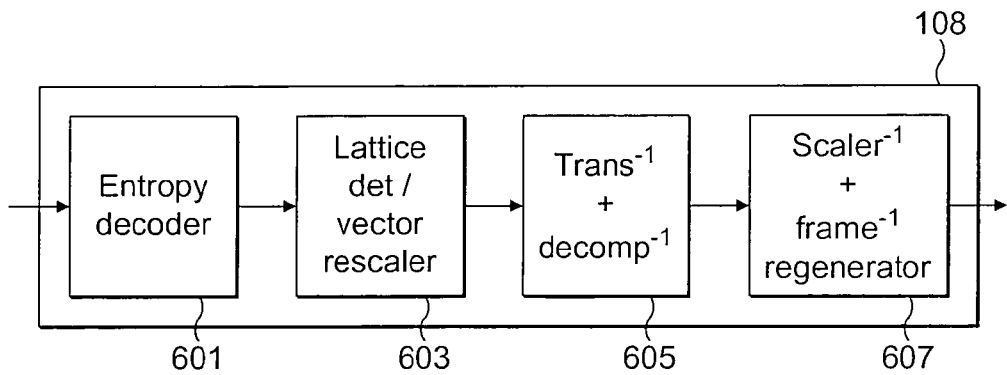
FIG. 11 shows schematically a decoder part of the audio codec system shown in FIG. 2.
Figure 12:
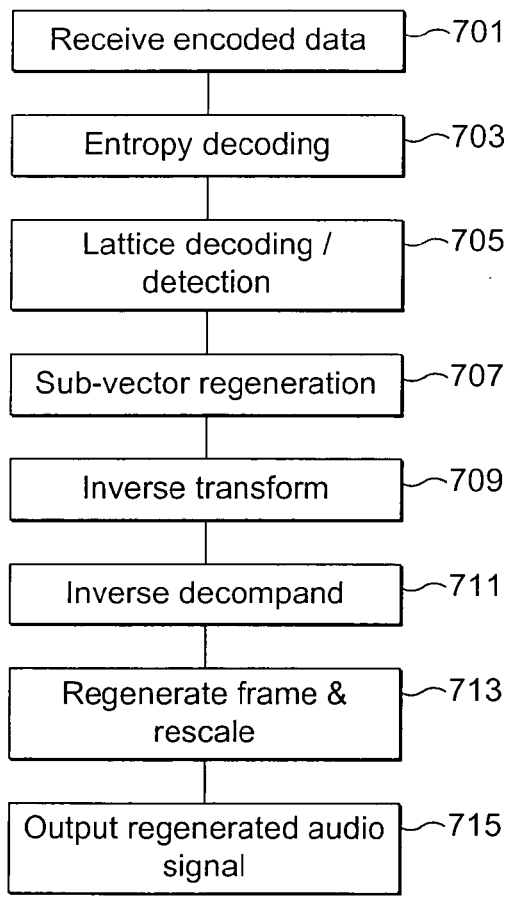
FIG. 12 shows a flow diagram illustrating the operation of an embodiment of the audio decoder as shown in FIG. 11 according to the present invention.

It would be appreciated that the schematic structures described in FIGS. 2, 3, 4 and 11, and the method steps in FIGS. 5a, 5b and 12 represent only a part of the operation of a complete audio codec as exemplarily shown implemented in the electronic device shown in FIG. 1.

Figure 2:
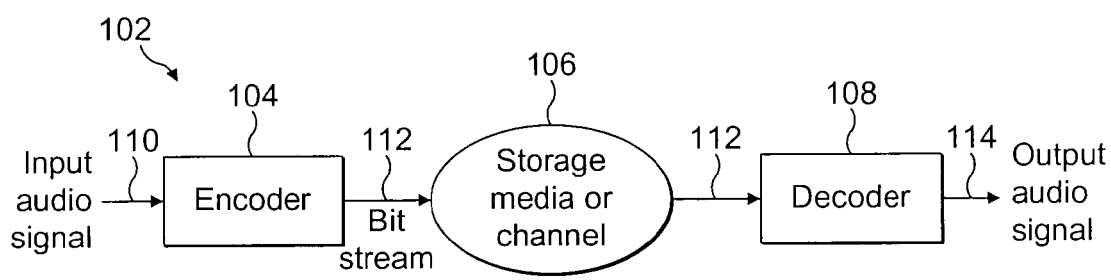
FIG. 2 shows schematically an audio codec system employing embodiments of the present invention.

The general operation of audio codecs as employed by embodiments of the invention is shown in FIG. 2. General audio coding/decoding systems consist of an encoder and a decoder, as illustrated schematically in FIG. 2. Illustrated is a system 102 with an encoder 104, a storage or media channel 106 and a decoder 108.

The encoder 104 compresses an input audio signal 110 producing a bit stream 112, which is either stored or transmitted through a media channel 106. The bit stream 112 can be received within the decoder 108. The decoder 108 decompresses the bit stream 112 and produces an output audio signal 114. The bit rate of the bit stream 112 and the quality of the output audio signal 114 in relation to the input signal 110 are the main features, which define the performance of the coding system 102.

FIGS. 3 and 4 depicts schematically an encoder 104 and in particular a quantizer 253 according to an exemplary embodiment of the invention. The operation of an encoder incorporating an embodiment of the invention is shown as flow diagrams FIGS. 5a and 5b.

The encoder 104 in step 301 of FIG. 5a receives the original audio signal. In a first embodiment of the invention the audio signal is a digitally sampled signal. In other embodiments of the present invention the audio input may be an analogue audio signal, for example from a microphone 11, which is analogue to digitally (A/D) converted by an ADC 14. In further embodiments of the invention the audio input is converted from a pulse code modulation digital signal to amplitude modulation digital signal.

The Framing Pre-processor 201 frames and in some embodiments of the invention pre-processes the audio signal. The Framing/Pre-processor receives information concerning the frame length variable and the sampling rate and segments the received samples into frames of arbitrary length dependent on the frame length variable. Furthermore the Framing/Pre-processor 201 may additionally segment each frame into an arbitrary number of sub-frames. The segmentation of the frames and sub-frames depends on the configuration of the coder, and in some embodiments of the invention, frames and sub-frames can be overlapped.

The Framing Pre-processor 201 may in some embodiments of the invention perform a high-pass filtering of the audio signal. In some embodiments for example a high-pass filter with a cut-off frequency of 67 Hz may be applied to the audio signal to attempt to remove the direct current component of the signal to be encoded.

The Framing and Pre-processing of the audio signal is shown in FIG. 5a by step 403.

The output of the Framing Pre-processor 201 is connected to the Source Modeller 215 and the Time Domain Weighting Processor 203.

The Source Modeller 215, also known as the Source/perception model estimation and quantizer receives the framed and pre-processed audio signal and applies a signal model to determine a series of p-order linear prediction coding (LPC) coefficients and a prediction gain every 20 ms. Furthermore the Source Modeller 215 generates an open-loop pitch period estimate every 10 ms.

The signal model comprising of the LPC model and pitch model based on the open-loop pitch period estimate is used as basis for the derivation of a van de Par perceptual model.

The estimation of components for the source/perception model is shown in FIG. 5a by step 405.

The Time Domain Weighting. Processor 203 receives the framed and pre-processed frames and sub-frames and performs a time domain weighting function on the signal dependent on the estimated model parameters passed to the Time Domain Weighting Processor 203 from the Source Modeller 215. The Time Domain Weighting Processor 203 uses a perceptual filter obtained from the perceptual model generated within the Source Modeller 215 to remove the irrelevancy from the signal to be encoded. In other words from the source modelling the framed audio signal has removed any time domain components which would be masked according to the perceptual signal.

The Time Domain weighting of the audio signal is shown in FIG. 5a by step 407.

The Time Domain Weighting processor 203 output is connected to the Adaptive Decomposator 205. The Adaptive Decomposator performs a series of actions to process the Time Domain Weighted signals.

The first action is performed by the Ringing Subtraction Processor 207 which receives the output of the Time Domain Weighting processor 203 input to the Adaptive Decomposator 205. The Ringing Subtraction Processor attempts to remove the intra-block dependencies within the signal. The output of the Ringing Subtraction Processor 207 is then passed to the Windowing Processor 209.

The Windowing Processor 209 then applies a time domain windowing or weighting to the input signals. The windowing function applied is dependent on the type of transform applied in the Transformer 211. In some embodiments of the invention the Windowing Processor 209 applies a window stitching mechanism.

The Transformer 211 receives the windowed signal and applies a transform to the audio signal. The Transformer 211 in a first embodiment of the invention is a Karhunen-Loeve Transform (KLT). In other embodiments of the invention other transforms may be used which although may change some of the data flow of the embodiment compared with the above mentioned embodiment should not affect the architecture as the components of the architecture are designed to be generic. Other types of transform are for example the Modulated Lapped Transform (MLT). The Transformer 211 outputs a series of transform coefficients.

The Adaptive Decomposition of the signal can be shown in FIG. 5*a* by the step 409.

The transformed signal transform coefficients are then further processed in the Transform Domain Weighting Processor 213 which may in some embodiments of the invention be a normalisation of the signal. In some embodiments of the invention the Transform Domain Weighting Processor 213 may perform a further weighting of the transformed signals in order to remove any transform dependent irrelevance. For example where the transformer operates to generate frequency coefficients the Transform Domain Weighting Processor 213 may, dependent on the perceptual model, generate a perceptual model to mask one frequency coefficient due to a dominating nearby frequency band signal.

The transform domain weighting process is shown in FIG. 5*a* by step 411.

The output of the Transform Domain Weighting Processor 213 is then passed to the quantizer 253, which performs a quantization process as shown in FIG. 5*a* as step 413 and described in further detail with respect to the schematic representation of the quantizer shown in FIG. 4 and the operation of the quantizer as shown in FIG. 5*b*.

The quantizer 253 comprises a sub-vector partitioner 301 which receives the transformed coefficients and outputs partitioned sub-vectors comprising groups of the transformed coefficients.

The sub-vector partitioner 301 performs a partitioning of the transformed coefficients according to predetermined transform coefficient bands to produce sub-vectors with a given dimensionality smaller than the total vector size.

The operation of partitioning is shown in FIG. 5*b* by step 415.

The output of the sub-vector partitioner 301 is connected to the clustering analysis processor 303 so that the partitioned sub-vectors may be passed to the clustering analysis processor 303.

The clustering analysis processor 303 may apply a clustering analysis process to the sub-vectors to determine any correlation or clustering within the sub-vector or between various sub-vectors. In a first embodiment of the invention the clustering analysis receives the coefficients of the sub-vectors. In other embodiments the clustering analysis may receive information generated by the selection of the model applied to the audio signals. For example the linear spectral frequency (LSF) coefficients generated by modelling the audio signal are processed to produce estimation of spectral envelope of the audio signal. The linear spectral frequency coefficients may be considered to be representations of the linear prediction coefficients (LPC). The LPC are extracted to model the spectral envelope of the signal, envelope that is used to derive the weighting of the transform coefficients to be quantized. In other words the architecture of the codec quantizes two parts, these two parts being the spectral envelope or model of the data (through the use of LSF coefficients) and the transform coefficients (KLT or MLT).

The distributions of the components are estimated by applying a mixture of Gaussian modelling algorithm. The mixture of Gaussian model algorithm as known in the art attempts to estimate a series of independent Gaussian distributions from a series of known data points, for example the LSF coefficients, which may be modelled in combination to determine the whole distribution of components. In other words the data is modelled as having a pdf of the form:

$$\text{Data} = \Sigma a_i f\_data_i(x)$$

where $a_i$ is a sub-unitary factor and $f\_data_i(x)$ is the function (pdf) of a Gaussian distribution with given mean and standard deviation. The following quantization of the data can as described hereafter group the data according to one of the mixture components—one of the Gaussian distributions, and subtract the mean accordingly (based on the mean of the Gaussian distribution in question) and quantize the data. The component giving the lowest Euclidean distortion may then be selected and the corresponding index i may be encoded and transmitted. Thus in embodiments of the invention the data from the entire input vector (not only the sub-vectors) may be considered to be identically distributed according to one of the mixture components.

In other embodiments of the invention other clustering analytical algorithms known to the person skilled in the art may be employed in order to determine if there is a correlation between any of the sub-vector components and if there is any correlation what correlation it is.

The clustering analysis operation is shown in FIG. 5*b* by step 417.

The clustering analysis processor 303 then, may in some embodiments of the invention for each Gaussian mixture distribution component (in other words each component of the offline trained mixture) generate a data set where the data set may be normalised according to the characteristics of the Gaussian distribution chosen. In other words the data is processed to remove the mixture component Gaussian distribution mean value.

The clustering analysis processor 303 may use this mean and variance matrix of the mixture of Gaussian model distribution component furthermore to define a relevant axis and angle of rotation.

The generation of the data set dependent on the mixture model component chosen in other words removing the mean and scaling with respect to the variance from the data for each component of the trained mixture is shown in FIG. 5*b* by step 419.

The clustering analysis processor 303 is furthermore connected to the lattice rotator 305. The lattice rotator 305 receives the component of the offline trained mixture (in other words the indication of an axis and angle of rotation) and performs a lattice rotation of an angle (Alpha) about the axis indicated and passes the rotated lattice information to the quantizer 307.

The rotation of the lattice according to the component of the trained mixture operation is shown in FIG. 5*b* by step 421. In other embodiments of the invention the lattice rotator 305 receives the indication of an axis and angle of rotation and performs the rotation on the data rather than the lattice. This, as appreciated by the person skilled in the art, would produce the same final result as it is the relative motion of the lattice to the data that produces the advantageous effect. Furthermore in performing the rotation on the data rather than the lattice the standard fast quantization algorithms used in lattice quantization in the art may be employed without need for significant modification to the algorithms.

Thus the embodiment of the invention may be considered to be an apparatus configured to be able to model a signal to estimate at least one distribution of the signal. The signal is rotated with respect to a lattice (for lattice quantization of the encoded signal), the rotation being dependent on the at least one distribution of the signal. The rotated signal being quantized with respect to the lattice as described below.

The quantizer 307 receiving the data from the clustering analysis any data generator 303 and the lattice rotation information from the lattice rotator 305 performs a lattice quantization using the rotated lattice on the data.

A brief description of lattice quantization will now follow in order to help to understand the invention. The lattice arrangement described is a $Z_n$ lattice in other words a n dimensional lattice where the rows and columns are aligned with each other. However it would be appreciated that other lattice configurations including but not limited to $A_n$, $D_n$, $D_n^+$, $D_n^*$ lattices may also be employed.

A $Z_n$ lattice contains all integer coordinate points of the n dimensional space. The dimension of the respective $Z_n$ lattice may be equal to the number of coefficients in the sub-vector. If a $Z_n$ lattice is used, the lattice quantization corresponds to rounding the scaled coefficients to the nearest integer to obtain quantized coefficients.

In a truncated lattice, the number of points of the lattice is limited. A finite truncation of the lattice forms a "codebook" and a respective point can be represented by a "codevector" listing a value for each dimension.

A rectangular truncated lattice, which we describe in this example as $Z_n$, within which the code vector is included, allows for a simple indexing algorithm.

The regular truncation uses the maximum absolute norm of a vector.

$$y=(y_1,y_2,\ldots,y_n) \in R^n$$

This is defined as:

$$N(y)=\max_{i=1:n}|y_i|$$

The rectangular truncation of the lattice $\Lambda$ is defined as:

$$\Lambda_K = \left\{(x_1, x_2, \ldots, x_n) \in \Lambda \mid \max_i |x_i| \le K\right\}$$

In the above n is the lattice dimension, $x_1$ to $x_n$ are the code vector components or transformed coefficients and K is the maximum norm of the truncated lattice. Thus, the maximum absolute value any component $x_1$ to $x_n$ of any code vector may take is equal to K.

A generalisation of the above formula is the truncation having a different maximum norm along different dimensions.

$$\Lambda_{\{K_i\}} = \left\{(x_1, x_2, \ldots, x_n) \in \Lambda \mid \max_i |x_i| \le K_i\right\}$$

In the following example the $Z_n$ lattice has the same maximum norm along all of the dimensions, however in some embodiments of the invention, different norms may be employed.

The exterior shell defined by the truncation is formed by the points.

$$\overline{\Lambda}_K = \left\{(x_1, x_2, \ldots, x_n) \in \Lambda \mid \max_i |x_i| = K\right\}$$

Each code vector resulting in the quantization can be represented by a respective index. That is, instead of encoding each vector component seperately, a single index may be generated and provided as an encoded audio signal for a respective vector, as will be described in more detail further below. The indexation component performs its indexing for each subband and/or subvector as the generation of the index to identify a vector or sub-vector may also be applied to LSF vectors.

When entropy coding is performed, a sufficiently large truncation should be considered, especially if there is need to know all the possible symbols to be encoded at the beginning of the encoding process.

In addition to generating the quantization information by applying the sub-vector/vector to the lattice, the lattice information may also be entropy encoded at the entropy encoder 313. In other words the apparatus in embodiments of the invention is further configured to entropy encode the quantized signal.

A further way to understand the invention is that in embodiments of the invention an apparatus is configured to: rotate an encoded vector signal with respect to a lattice, for lattice quantization of the encoded signal, wherein the rotation is selected to align the lattice with densest denser direction of the encoded signal. Furthermore that the apparatus determines the denser direction of the encoded signal by applying a mixture of Gaussian model to the encoded vector signal.

The application of the rotated lattice on the sub-vector/vector (or the rotated sub-vector/vector to the lattice) to generate the quantized data may be carried out by any known lattice quantization method.

The quantization of the data using the 'rotated' lattice operation is shown in FIG. 5b by step 423.

The denormalizer and distortion calculator 309 receives the output of the quantizer 307 and also of the sub-vector partitioner 301. The denormalizer and distortion calculator 309 initially performs a denormalization of the quantized output.

The denormalization of the quantized output operation is shown in FIG. 5b by step 425.

Furthermore the denormalization and distortion calculator 309 calculates the distortion of the denormalized quantized output against the original data from the sub-vector partitioner 301. The result of the denormalizer and distortion calculator may be passed to the selector 311 along with the output of the quantizer.

The calculation of the distortion of the quantized value with respect to the original signal is shown in FIG. 5b by step 427.

The selector 311 having received the output of the distortion calculator 309 and the quantizer 307 selects the mixture component with the minimum distortion. In other words in embodiments of the invention the apparatus is configured to model the signal to estimate at least two distributions, and for each rotation and quantization estimates a distortion parameter associated with the quantized signal; and then selects one of the at least two distributions with the smallest associated distortion parameter.

The distortion parameter in some embodiments of the invention is the Euclidean distance between the quantized signal and the signal.

The mixture component with the minimum distortion selection operation is shown in FIG. 5b by step 429.

Although the above embodiment has shown the comparison process to be a parallel where each component is generated and compared at the same time, in some embodiments of the invention the process may be a series one where the distortion of each component choice is compared against one previous choice distortion and the lowest one selected and the sequence of choosing and determination of distortion value repeated until each choice has been made.

The output of the selector 311 is then passed to the entropy encoder 313.

The entropy encoder 313 entropy encodes the index value of the selected rotated lattice codevector together with any other index to be entropy encoded, for example the rotation angle and axis or a series of separate 2×2 angle and axis markers resulting in a higher dimensional rotation. In some embodiments of the invention the angle and axis of rotation is known given the mixture component index which may be encoded and transmitted (in these embodiments of the invention the distribution index defines the best approximation of the mean and covariance matrix of the data).

In other words the apparatus may be configured to rotate the signal with respect to a lattice by applying a transform to the signal to rotate the signal by a first angle about a first axis, but may be configured to apply at least one further transform to the rotated signal to further rotate the rotated signal by a further angle about a further axis.

The entropy coding of the values can be a Huffman coding, Shannon coding, arithmetic coding, or any other encoding method that may attempt to assign smaller codeword length to the more frequent values of the component values.

This entropy encoding is shown in FIG. 5b by step 431.

In a further embodiment of the invention, the linear spectral frequency (LSF) data is processed according to the Gaussian mixture modelling algorithm and the modelled data then being mean removed, de-correlated, normalized, companded, uniform scalar quantized and then entropy encoded. The entropy encoding is performed only on the scalar quantizer values obtained for the mixture components giving the smallest distortion.

In some embodiments of the invention the clustering analysis is replaced by apparatus which determines information on the mean and covariance matrix of the data. By determining the mean and covariance of the data a direction of density of data components may be determined and an appropriate rotation angle and axis chosen in order to generate a low distortion quantized output.

In a further embodiment of the invention an iterative rotation process may be employed which selects an axis and angle for rotation of the data and then attempts to iteratively reduce the distortion by selecting further axis and angles of rotation.

Figure 6:
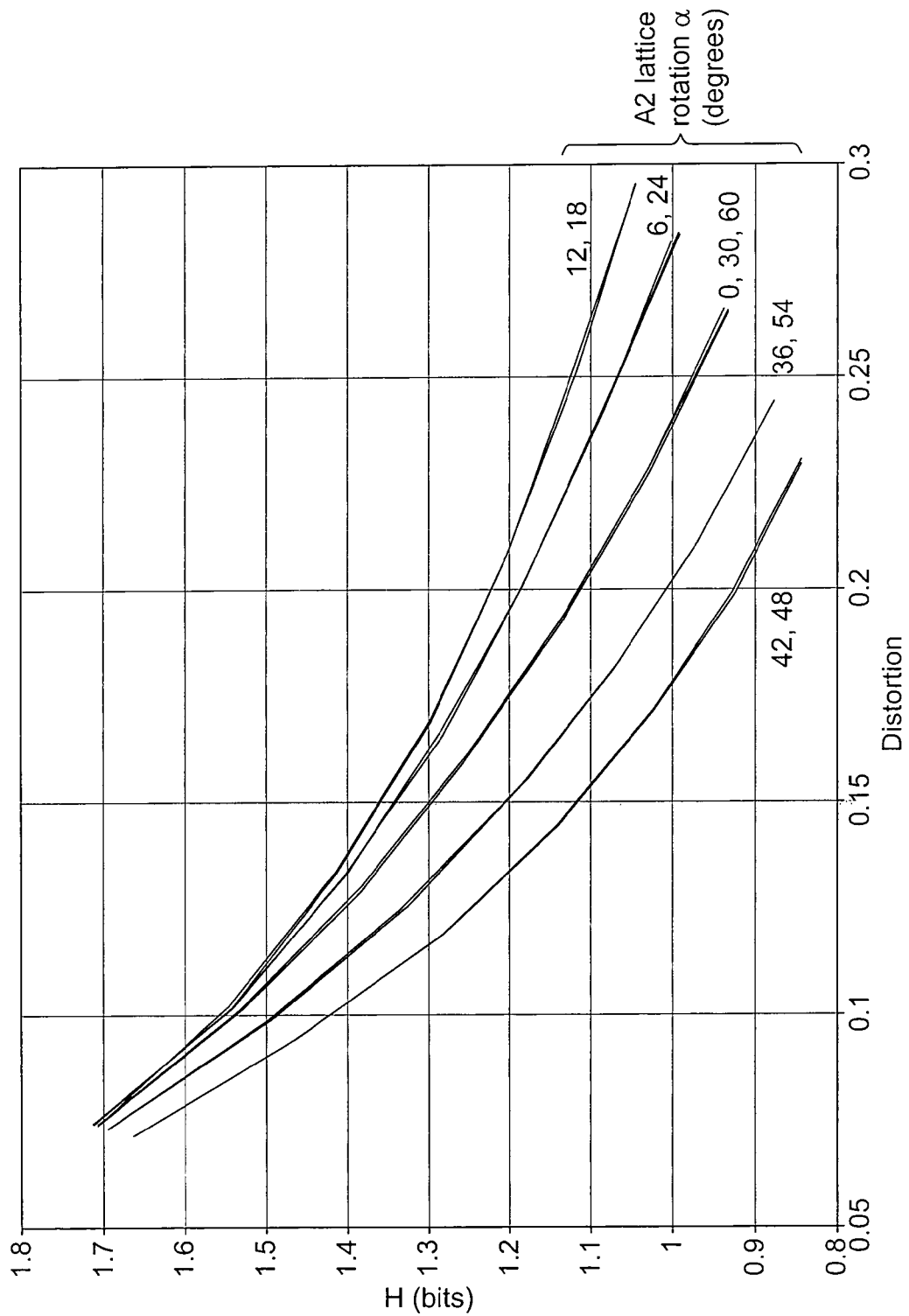
FIG. 6 shows a graphical representation of the rate distortion functions for a series of rotated A2 lattices for Gaussian correlated sources with a correlation coefficient of 0.9.
Figure 7:
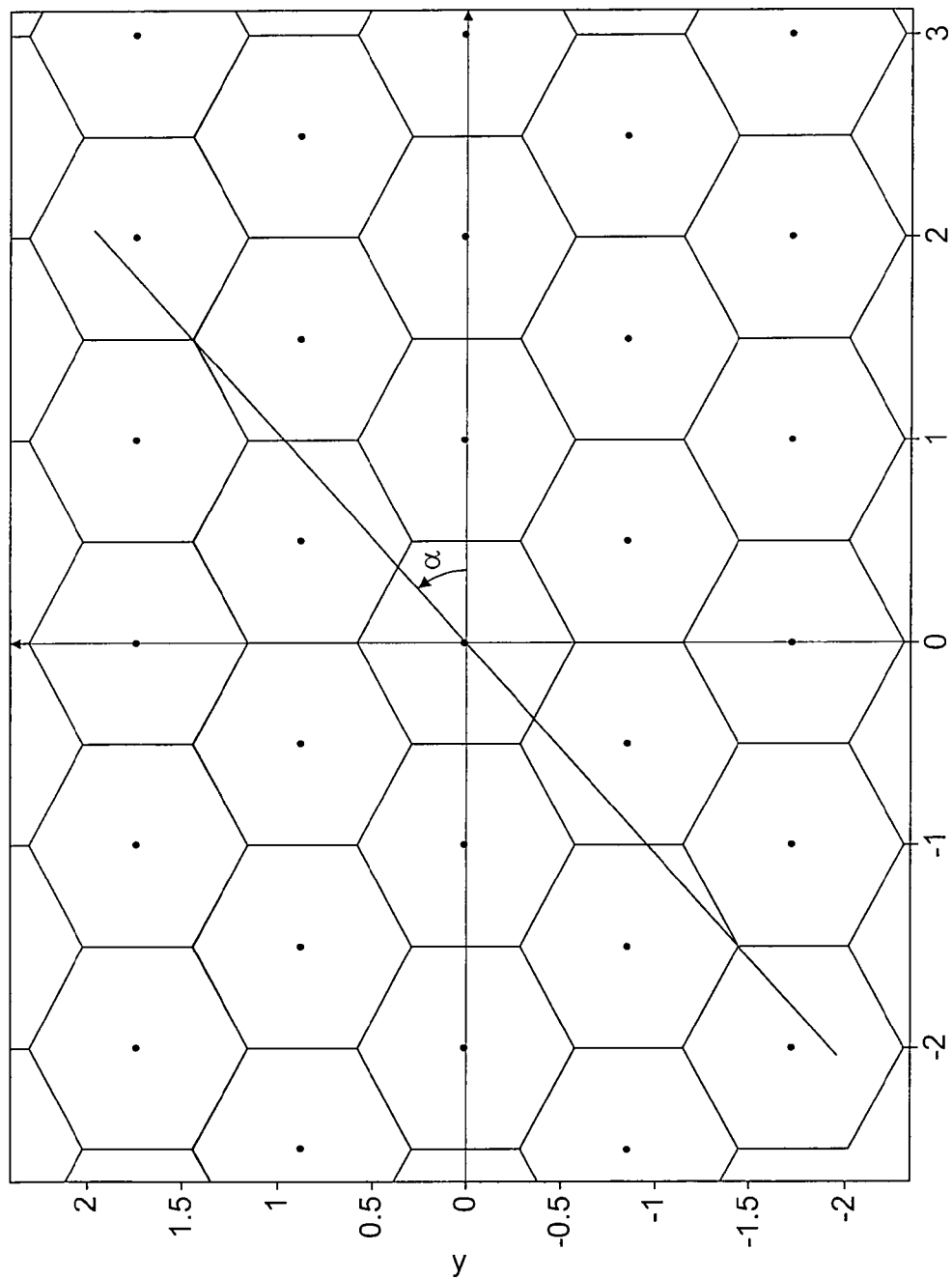
FIG. 7 shows a graphical representation of an A2 lattice with associated Voronoi partitions.

The graph shown in FIG. 6 shows the effect of rotation of an A2 (otherwise known as a hexagonal lattice rotated and the distortion with respect to the number of bits used in entropy coding. It can be shown from FIG. 6 that the rate of distortion occurs is minimized for correlated data when the rotation angle Alpha approaches 45°. This angle alpha can be seen from the graph in FIG. 7 which shows a lattice arrangement, together with associated Voronoi partitions. FIG. 7 clearly shows that for correlated data, in other words in a two dimensional space where one of the vectors is correlated with the other vector, a rotation of approximately 45° can be used to minimise distortion.

Figure 8:
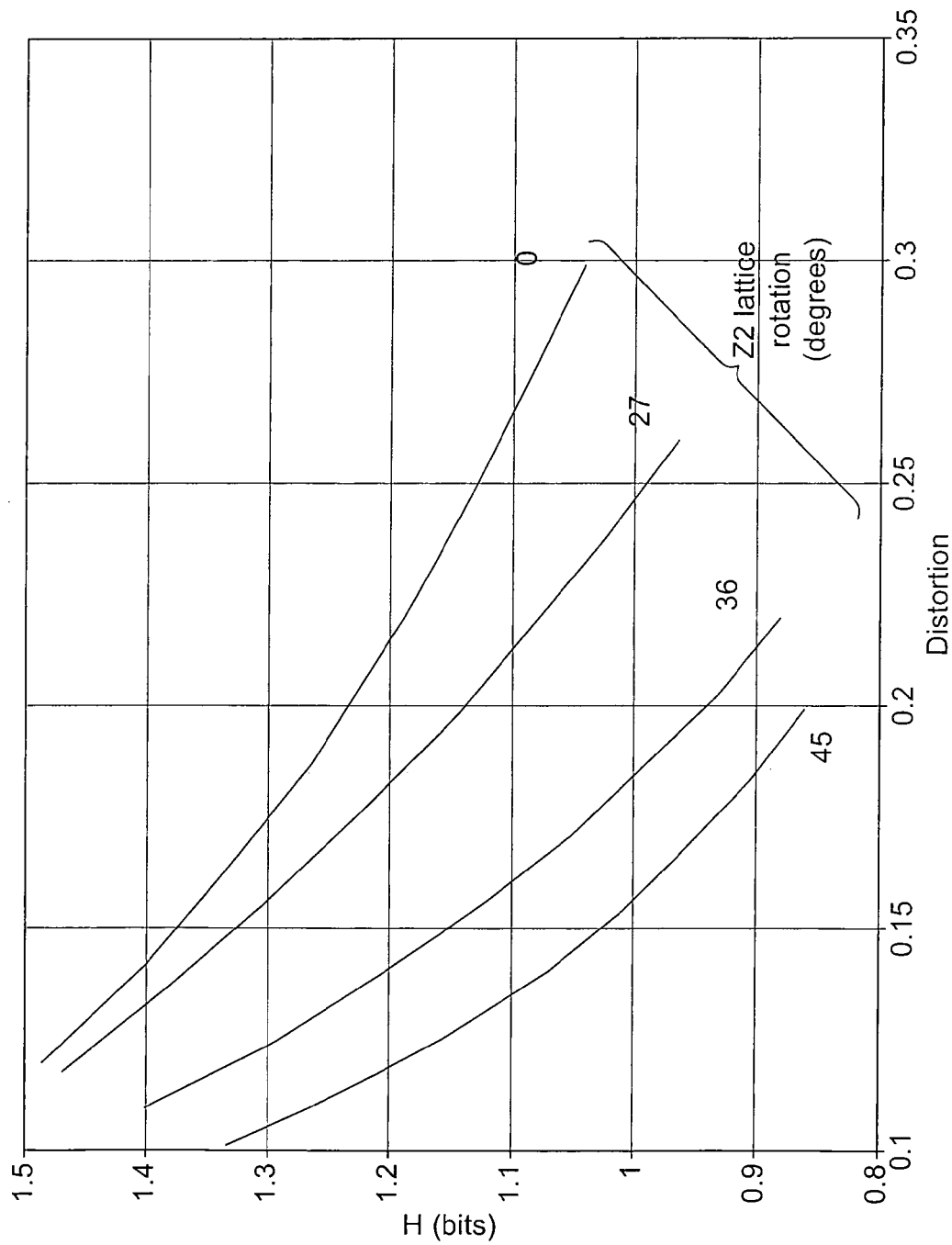
FIG. 8 shows a graphical representation of rotated Z2 lattices for Gaussian correlated sources with a correlation coefficient of 0.9.

With respect to FIG. 8, similar behaviour to that shown in FIGS. 6 and 7 can be seen with respect to rotation using a Z2 lattice (The rotation of the Z2 lattice by the angle Beta produces a minimized distortion curve for a rotation of approximately 45°.

Both graphs show that where correlation between vector values can be shown—as would be indicated by any clustering analysis that the rotation which aligns an axis of the lattice to be generally along the line of correlation reduces the distortion curve for all values of bit encoding and specifically where low bit rate encoding is used.

Figure 9:
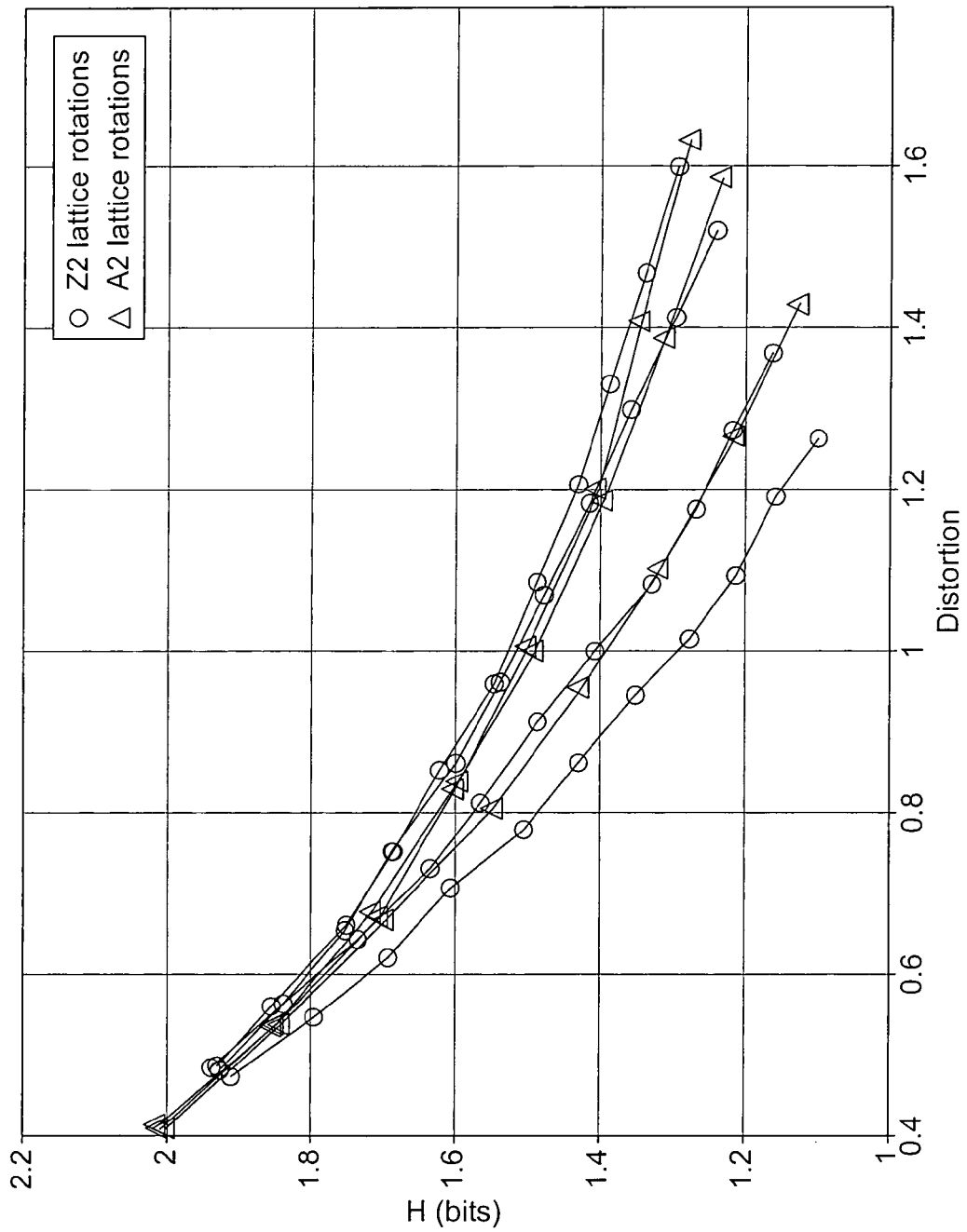
FIG. 9 shows graphical representations of rotated Z2 and A2 lattices for non-correlated Gaussian sources with a standard deviation ratio of 1.4.

Another example where rotation is beneficial can be shown with respect to FIG. 9 which shows the effect of rotation for both the Z2 and A2 lattices for non correlated Gaussian sources. In this example, data with different variances along each direction, or with data having vanishing directions, in other words that the variance values along some of the component directions are much larger than the others may be rotated in order to produce a lower distortion curve.

As previously mentioned, the proposed methods attempt to align the densest direction of the lattice to the principal access of the data. The definition of the densest direction of a lattice is the direction given by the lattice basis vector having the smallest Euclidian norm. In practical situations there are often several such directions, however in embodiments of the invention the selection may concentrate on the one in the first quadrant only to reduce the complexity of the search.

Thus in embodiments which attempt to quantize correlated sources, the principal directions along the intersection of the bisector hyperplanes between the correlated components may be taken in two-by-two arrangement.

Therefore if in embodiments the densest direction of the lattice corresponds to one of the orthogonal basis vectors of the real multidimensional space, it is possible in embodiments of the invention to implement rotations of 45 degrees in order to produce optimal distortion characteristics of the quantization.

In higher dimensional rotation matrices can be obtained through combinations of rotations in planes generated by components taken two-by-two, independent of the rotation angle.

Figure 10:
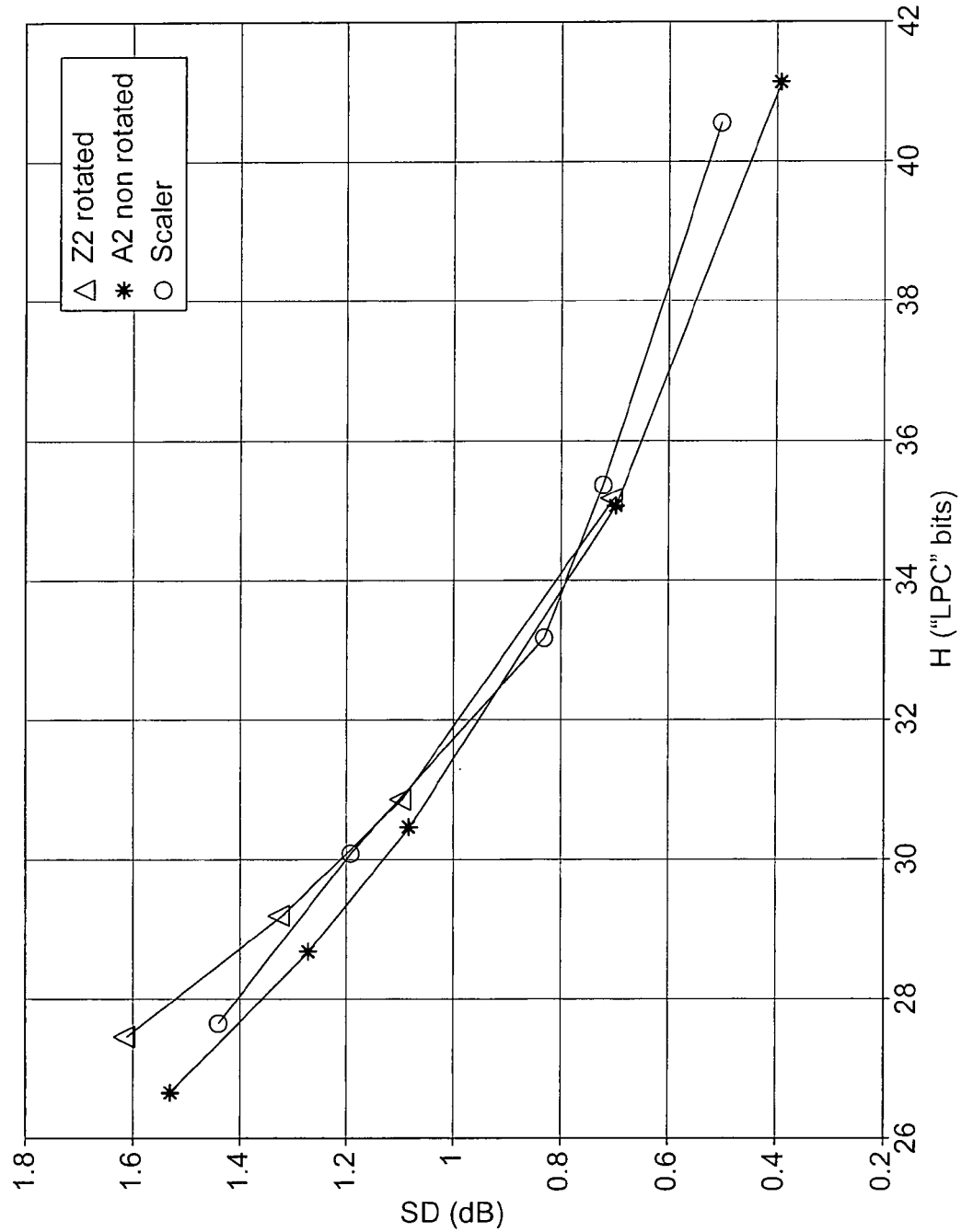
FIG. 10 shows graphical representations of the theoretical number of bits needed to encode LPC coefficients including entropy encoding for rotated Z2 lattice quantization, Z2 lattice quantization and scalar quantization.

In such embodiments such as shown in FIG. 10, it can be shown that the use of lattice rotation techniques gives lower distortion for equivalent bitrates in speech and audio coding context. The beneficial impact of the proposed embodiments can be seen to be particularly useful for lower bitrates.

With respect to FIG. 11 a schematic view of an embodiment of a decoder 108 is shown. Furthermore the operation of the decoder will be further explained with the assistance of FIG. 12.

The decoder as implemented in embodiments of the invention receives the entropy encoded signal in the entropy decoder 601. The entropy decoder performs an entropy decoding of the entropy encoded signal to retrieve the quantized index values, any entropy encoded lattice definitions, and any other entropy encoded side information required to decode the audio signal, for example the angle and the axis or rotation or a series of 2 dimensional angle and axis of rotation.

The reception of the signal at the decoder is shown in FIG. 12 by step 701.

The operation of the entropy decoding 601 is shown in FIG. 12 by step 703.

Both the lattice value, the rotation and the index values may then be passed to the lattice detector/sub-vector regenerator 603.

The lattice detector/vector regenerator 603 determines the lattice arrangement and rotation used in the quantization process within the encoder. In some embodiments of the invention it is the lattice codevector rotation which is determined and from this value the regenerated codevector is rotated back to its original position prior to the original rotation in the encoder. In some embodiments of the invention the angle and axis of rotation may be stored within the decoder and used for subsequent blocks where there is no new information detailing a change of the rotation angle and axis.

The detection of the lattice arrangement is shown in FIG. 12 by step 705.

Furthermore the lattice detector/vector regenerator 603 using the component values and the determined and rotated lattice arrangement is configured to regenerate the sub-vector (with the errors generated by the quantization process).

The regeneration of the sub-vector operation is shown in FIG. 12 by step 707.

The sub-vector information is then passed to the inverse transformer and inverse decompander 605.

The inverse transformer and inverse decompander 605 first performs an inverse transform to that performed within the encoder.

The operation of the inverse transformation is shown in FIG. 12 by step 709.

The inverse transformer and inverse decompander 605 furthermore may perform a inverse decompanding operation to reverse the remaining decompanding operation as carried out within the encoder 104.

The inverse decompanding operation is shown in FIG. 12 by step 711.

The output of the inverse transformer and inverse decompander 605 is input to a inverse scaler and frame regenerator 607. The inverse scaler and frame regenerator 607 carries out the reverse processes to the scaling carried out according to the audio model employed and furthermore regenerates the audio signal from the frame structure used in the encoder 104.

The rescaling and regenerating of the audio signal is shown in FIG. 12 by step 713.

Finally the regenerated audio signal is output as shown in FIG. 12 by step 715

Therefore in other words the apparatus in embodiments of the invention can be seen to be configured to: determine at least one rotation angle and axis from a first part of an encoded signal; apply the at least one rotation angle about the rotation axis to a second part of the encoded signal with respect to a lattice; and generate a de-quantized signal dependent on the rotated second part of the encoded signal with respect to the lattice.

The embodiments of the invention described above describe the codec in terms of separate encoders 104 and decoders 108 apparatus in order to assist the understanding of the processes involved. However, it would be appreciated that the apparatus, structures and operations may be implemented as a single encoder-decoder apparatus/structure/operation. Furthermore in some embodiments of the invention the coder and decoder may share some/or all common elements.

Although the above examples describe embodiments of the invention operating within a codec within an electronic device 610, it would be appreciated that the invention as described below may be implemented as part of any variable rate/adaptive rate audio (or speech) codec. Thus, for example, embodiments of the invention may be implemented in an audio codec which may implement audio coding over fixed or wired communication paths.

Thus user equipment may comprise an audio codec such as those described in embodiments of the invention above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

For example the embodiments of the invention may be implemented as a chipset, in other words a series of integrated circuits communicating among each other. The chipset may comprise microprocessors arranged to run code, application specific integrated circuits (ASICs), or programmable digital signal processors for performing the operations described above.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs) and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising:
   at least one processor; and
   at least one memory including computer program code,
      where the at least one memory and the computer program code are configured, with the at least one processor, to cause the apparatus to at least:
   model a vector of coefficients of a speech signal to estimate at least one distribution of the vector of coefficients of the speech signal;
   rotate the vector of coefficients of the speech signal with respect to a lattice, for lattice quantization of the vector of coefficients of the speech signal, dependent on the at least one distribution, wherein the rotation is selected to align a densest direction of the lattice with a denser direction of the vector of coefficients of the speech signal; said apparatus configured to determine the denser direction of the vector of coefficients of the speech signal by applying a mixture of Gaussian model to the vector of coefficients of the speech signal; and quantize the vector of coefficients of the speech signal rotated with respect to the lattice.

2. The apparatus as claimed in claim 1, wherein the at least one memory including the computer program code is configured with the at least one processor to cause the apparatus to entropy encode the quantized vector of coefficients of the speech signal.

3. The apparatus as claimed in claim 1, wherein the at least one memory including the computer program code is configured with the at least one processor to cause the apparatus to model the vector of coefficients of the speech signal to estimate at least two distributions, wherein for each quantization the at least one memory including the computer program code is configured with the at least one processor to cause the apparatus to:

estimate a distortion parameter associated with the quantized vector of coefficients of the speech signal; and select one of the at least two distributions with the smallest associated distortion parameter.

4. The apparatus as claimed in claim 1, wherein the modeling comprises at least one of:
a mixture of Gaussian modeling;
a clustering analysis modeling; and
a correlation analysis.

5. The apparatus as claimed in claim 1, wherein the at least one memory including the computer program code is configured with the at least one processor to cause the apparatus to rotate the vector of coefficients of the speech signal with respect to a lattice by applying a transform to the vector of coefficients of the speech signal to rotate the vector of coefficients of the speech signal by a first angle about a first axis.

6. The apparatus as claimed in claim 5, wherein the at least one memory including the computer program code is configured with the at least one processor to cause the apparatus to apply at least one further transform to the rotated vector of coefficients of the speech signal to further rotate the rotated vector of coefficients of the speech signal by a further angle about a further axis.

7. A method comprising:
modeling, in a processor, a vector of coefficients of a speech signal to estimate at least one distribution of the vector of coefficients of the speech signal;
rotating, in the processor, the vector of coefficients of the speech signal with respect to a lattice, for lattice quantization of the vector of coefficients of the speech signal, dependent on the at least one distribution, wherein the rotation is selected to align a densest direction of the lattice with a denser direction of the vector of coefficients of the speech signal;
determining the denser direction of the vector of coefficients of the speech signal by applying a mixture of Gaussian model to the vector of coefficients of the speech signal; and
quantizing, in the processor, the vector of coefficients of the speech signal rotated with respect to the lattice.

8. The method as claimed in claim 7, wherein modelling the vector of coefficients of the speech signal comprises modeling the vector of coefficients of the speech signal to estimate at least two distributions, and rotating and quantizing for each distribution, wherein the method further comprises:

estimating a distortion parameter associated with the quantized vector of coefficients of the speech signal; and selecting one of the at least two distributions with the smallest associated distortion parameter.

9. The method as claimed in claim 7, wherein modeling comprises at least one of:
a mixture of Gaussian modeling;
a clustering analysis modeling; and
a correlation analysis.

10. The method as claimed in claim 7, wherein the rotating the vector of coefficients of the speech signal with respect to the lattice comprises applying a transform to the vector of coefficients of the speech signal to rotate the vector of coefficients of the speech signal by a first angle about a first axis.

11. The method as claimed in claim 10, wherein the rotating the vector of coefficients of the speech signal with respect to the lattice further comprises applying at least one further transform to the rotated vector of coefficients of the speech signal to further rotate the rotated vector of coefficients of the speech signal by a further angle about a further axis.

12. A non-transitory computer readable medium embodying computer program code, the computer program code executed by a processor to perform operations comprising:
modeling, in the processor, a vector of coefficients of a speech signal to estimate at least one distribution of the vector of coefficients of the speech signal;
rotating, in the processor, the vector of coefficients of the speech signal with respect to a lattice, for lattice quantization of the vector of coefficients of the speech signal, dependent on the at least one distribution, wherein the rotation is selected to align a densest direction of the lattice with a denser direction of the vector of coefficients of the speech signal;
determining the denser direction of the vector of coefficients of the speech signal by applying a mixture of Gaussian model to the vector of coefficients of the speech signal; and
quantizing, in the processor, the vector of coefficients of the speech signal rotated with respect to the lattice.

13. The non-transitory computer readable medium as claimed in claim 12, wherein modeling the vector of coefficients of the speech signal comprises modeling the vector of coefficients of the speech signal to estimate at least two distributions, and rotating and quantizing for each distribution, further comprising:

estimating a distortion parameter associated with the quantized vector of coefficients of the speech signal; and selecting one of the at least two distributions with the smallest associated distortion parameter.

14. The non-transitory computer readable medium as claimed in claim 12, wherein modeling comprises at least one of:
a mixture of Gaussian modeling;
a clustering analysis modeling; and
a correlation analysis.

15. The non-transitory computer readable medium as claimed in claim 12, wherein the rotating the vector of coefficients of the speech signal with respect to the lattice comprises applying a transform to the vector of coefficients of the speech signal to rotate the vector of coefficients of the speech signal by a first angle about a first axis.

16. The non-transitory computer readable medium as claimed in claim 15, wherein the rotating the vector of coefficients of the speech signal with respect to the lattice further comprises applying at least one further transform to the rotated vector of coefficients of the speech signal to further rotate the rotated vector of coefficients of the speech signal by a further angle about a further axis.

* * * * *